United States Patent [19]

Huang

[11] 3,890,630

[45] June 17, 1975

[54] IMPATT DIODE

[75] Inventor: Ho-Chung Huang, Hightstown, N.J.

[73] Assignee: RCA Corporation, New York, N.Y.

[22] Filed: Oct. 9, 1973

[21] Appl. No.: 404,793

[52] U.S. Cl. .................. 357/13; 331/107 R; 357/15; 357/57; 357/89

[51] Int. Cl. .............................................. H01l 9/00

[58] Field of Search .................... 317/235 T, 235 K; 331/107 R; 357/1, 13, 57, 89

[56] References Cited

UNITED STATES PATENTS

| | | | |
|---|---|---|---|
| 2,899,652 | 8/1959 | Read | 317/235 K |
| 3,270,293 | 8/1966 | De Loach et al. | 317/235 T |
| 3,493,821 | 2/1970 | Bittmann et al. | 331/107 R |
| 3,621,466 | 11/1971 | Misawa | 331/107 R |
| 3,673,514 | 6/1972 | Coleman, Jr. et al | 331/107 R |

OTHER PUBLICATIONS

Sze, SM, Physics of Semiconductor Devices, N.Y., Wiley-Interscience, 1969, pp. 202, 203, 236, 237, 254, 255, 412, 413.

*Primary Examiner*—Martin H. Edlow
*Assistant Examiner*—William D. Larkins
*Attorney, Agent, or Firm*—Edward J. Norton; Joseph D. Lazar; Michael A. Lechter

[57] ABSTRACT

An IMPATT diode having four conducting regions. The relationship between the two center conducting regions in both thickness and carrier concentration are chosen such that breakdown voltage equals punch-through voltage. By controlling the carrier concentration between these two regions, the efficiency of the IMPATT diode is improved.

4 Claims, 3 Drawing Figures

IMPATT DIODE

BACKGROUND OF THE INVENTION

The invention herein disclosed was made in the course of or under a contract or subcontract thereunder with the Department of the Army.

The present invention relates to an IMPATT diode having improved efficiency at its desired operating frequency.

The IMPATT diode is used as a microwave power source. By reverse biasing an IMPATT diode, the resulting avalanche and transit time cause a high frequency negative resistance. That is to say, the physical structure of the IMPATT diode, when reverse biased, causes a phase differential of 180° between the output voltage and the output current. The microwave negative resistance makes possible high frequency power amplification or oscillation, depending on the type of circuit that makes use of the IMPATT diode.

It is desirable to have the IMPATT diode operate with its breakdown voltage equal to its punch-through voltage. When operating under such conditions, there is little chance for a premature burnout or excess loss of power.

The direct current (dc) to high frequency (rf) conversion efficiency of an IMPATT diode is dependent on the ratio of the carrier concentration of the two center N-type subregions. It is desirable to control these carrier concentrations in order to improve IMPATT diode efficiency.

SUMMARY OF THE INVENTION

A semiconductor diode comprising a body of single crystalline semiconductor material having a region of P-type conductivity and a region of an N-type conductivity, with a PN junction therebetween. The N-type region is divided into three subregions. The carrier concentration and thickness of the center subregion is in such relationship to the carrier concentration and thickness of the subregion contiguous to the PN junction, that the punch-through voltage equals the breakdown voltage at the operating frequency of the diode.

THE PREFERRED EMBODIMENT STRUCTURE

Figure 1:
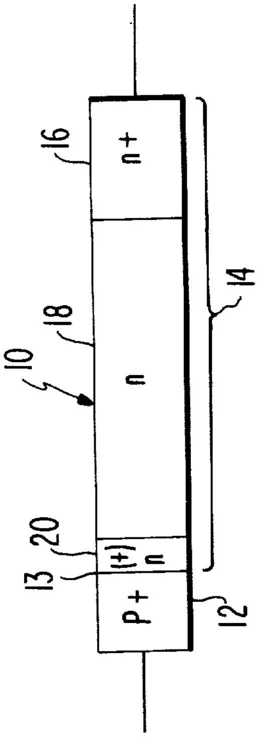
FIG. 1 is a cross-sectional view of the IMPATT diode of the present invention.

Referring to FIG. 1, the present embodiment of the IMPATT diode is designated as 10. The IMPATT diode 10 comprises a body of single crystalline semiconductor material, such as silicon, gallium arsenide and the like, having two regions of opposite conductivity, designated 12 and 14. Region 12 is of a P-type conductivity, with a high carrier concentration, that forms a PN junction 13, with the region 14, which is of N-type conductivity. Region 12, of the present embodiment of the IMPATT diode, can be replaced by a Schottky barrier with no change in results. N-type conductive region 14 includes three subregions, designated 16, 18 and 20, which vary in carrier concentration and thickness. Subregion 16 is of a high carrier concentration and only functions as an electrical contact.

Subregions 18 and 20 are critical in that the proper relationship between their respective carrier concentrations and widths result in the punch-through voltage being nearly equal to the breakdown voltage. Punch-through voltage is that voltage for which the depletion layer in the reverse-biased PN junction spreads sufficiently to make electrical contact with the junction at the interface of subregions 16 and 18. Breakdown voltage is defined as the reverse bias voltage needed to cause a reverse current flow due to avalanching. When the punch-through voltage equals the breakdown voltage, the IMPATT diode operates at a higher efficiency with less of a possibility of a premature burnout.

The carrier concentration $n_1$, and width $l_1$, of subregion 20 and the carrier concentration $n_2$ and width $l_2$ of subregion 18 are determined as follows:

The width $l_2$ of subregion 18 is determined by the equation:

$$l_2 = (v_s/2f) \tag{1}$$

where $v_s$ is the known saturation velocity of electrons for the particular semiconductor material used, and $f$ is the frequency at which the IMPATT diode 10 will be operating. With $v_s$ and $f$ known, the width $l_2$ is calculated by equation (1).

Carrier concentration $n_2$ of subregion 18 can be determined by the following equation:

$$n_2 = \tfrac{1}{2}\,(E_c^2\epsilon/v_B e) \tag{2}$$

where $V_B$ is the semiconductor breakdown voltage, $E_c$ is the critical electric field, $e$ is the electron charge, and $\epsilon$ is the dielectric constant.

The above relationship is graphically represented in the article by T. Misawa, "Microwave Silicon Avalanche Diode With Nearly-Abrupt-Type Junction," IEEE TRANSACTIONS ON ELECTRON DEVICES, Vol. ED–14, Sept. 1967, page 582. Thus, carrier concentration $n_2$ can be calculated by equation (2) or more conveniently by the Misawa graph.

Once $n_2$ is known, $n_1$ is determined by using the following formula:

$$n_1 = \{[(2\pi\eta m_2+\pi\eta+1)n_2]/[m_2^2(1-\pi\eta)]\} \tag{3}$$

where $\eta$ is the operating efficiency and $m_2$ is the power law for subregion 18. Operating efficiency of the IMPATT diode 10 is selected for the particular design requirement, usually about 30. Power law $m_2$ is a function of the critical electric field, $E_c$, and is calculated by:

$$m = 2\,[(6.85\times10^5)/E_c]^2 \tag{4}$$

The value of critical electric field, $E_c$, for a particular carrier concentration has been previously ascertained and this relationship is graphically shown in a book by H. A. Watson, MICROWAVE SEMICONDUCTOR DEVICE AND THEIR CIRCUIT APPLICATION, 1969, Page 124. As a designing rule of thumb, since $E_c$ is a slow varying function of $n_1$, the value of $n_2$, which is known from the Watson graph, can be used to determine the value of $E_c$. Once $E_c$ is determined, it is substituted into equation (4), and $m_2$ can thus be calculated from equation (4).

Figure 2:
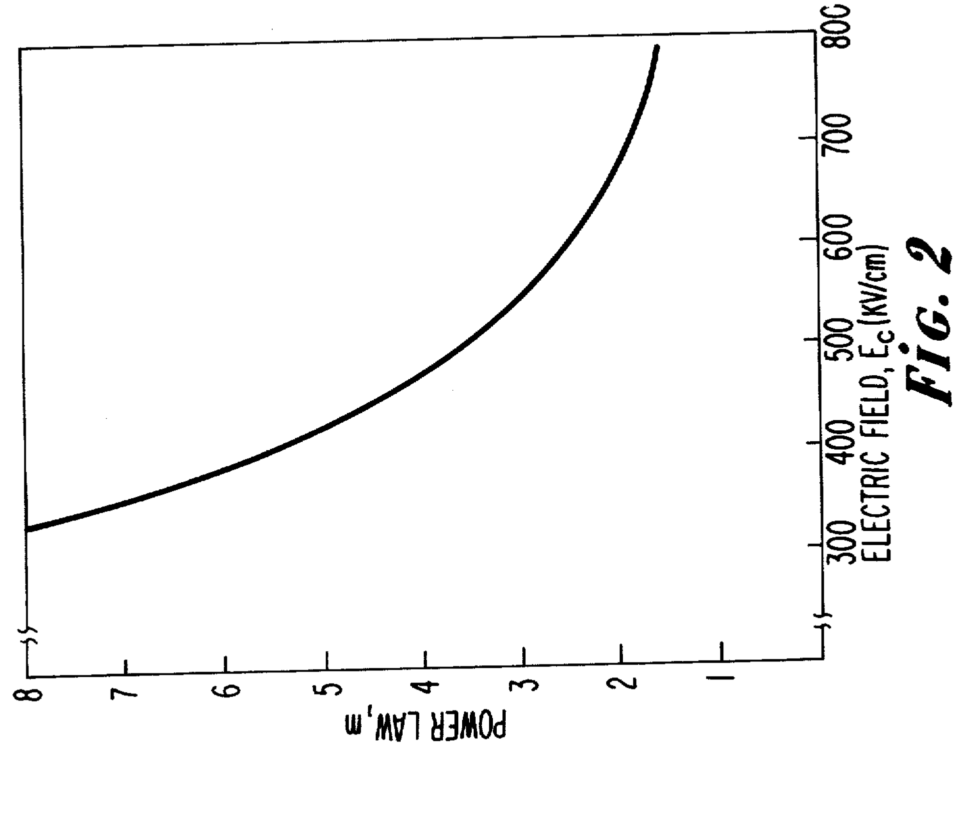
FIG. 2 is a graphical representation of the electrical field to the power law.

For convenience, equation (4) has been plotted as FIG. 2, thus by ascertaining the critical electric field, $E_c$, the power law $m_2$ can be taken from this graph.

Figure 3:
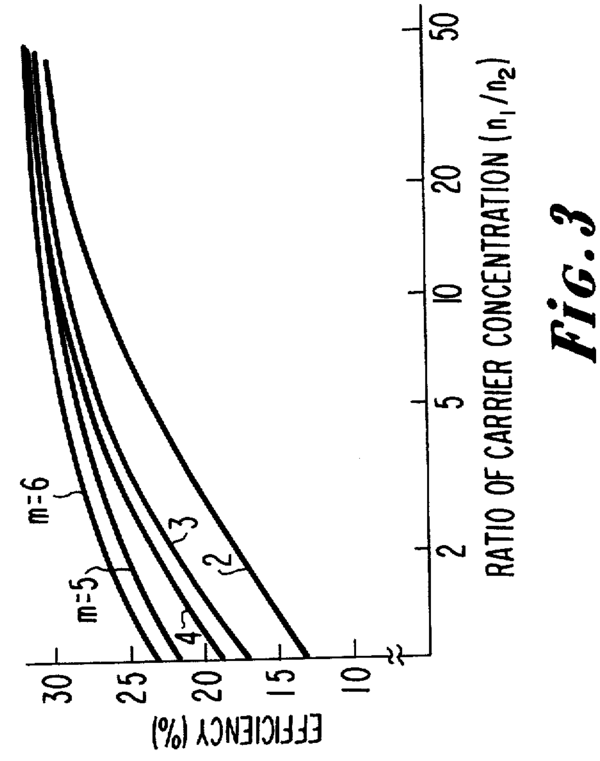
FIG. 3 is a family of curves representing the operating efficiency to the ratio of carrier concentration for specific values of the power law.

FIG. 3 is a graphical representation of operating efficiency, $\eta$, to the ratio of carrier concentration, $(n_1/n_2)$, for specific values of $m_2$. Once the operating efficiency has been selected and $m_2$ is known from FIG. 2, FIG. 3 yields the ratio $(n_1/n_2)$, from which $n_1$ is determined since $n_2$ has been ascertained from either equation (2) or the Misara graph. Thus, FIG. 3 is the graphical representation of equation (3).

The last design value to be determined is $l_1$, which is ascertained by the following equation:

$$l_1 = \{E_c/[(m_1+1)\ (n_1e/\epsilon)]\} \quad (5)$$

where $e$ is the electron charge and $\epsilon$ is the dielectric constant. Both $e$ and $\epsilon$ are constants which are known, $\epsilon$ is a different constant for each specific semiconductor material. $E_c$ has been determined, and since $n_1$ has been calculated, then FIG. 2 yields the value of $m_1$. With $E_c$ and $m_1$ known, $l_1$ is calculated from equation (5).

With $n_1$, $n_2$, $l_1$ and $l_2$ known, the design of the $P^+-n^+-n-n^+$ IMPATT diode structure is completed. The following is a design example for the $P^+-n^+-n-n^+$ IMPATT diode structure of GaAs, at an operating frequency of 10 GHz.

From equation 1:

$$l_2 = (v_s/2f)$$

where $v_s = 1 \times 10^7$ cm/sec for GaAs thus $l_2 = 5$ microns.

With $l_2$ known, $n_2$ is determined from equation (2) or more conveniently from the Misawa graph which yields:

$$n_2 = 6 \times 10^{15}\ \text{cm}^{-3}.$$

Referring to the Watson graph, with $n_2 = 6 \times 10^{15}$ $\text{cm}^{-3}$ for GaAs $$E_c = 4.50 \times 10^5\ \text{v/cm}.$$

Once $E_c$ is known, FIG. 2 yields $m_2$ which in this design example is equal to 4.6. If an operating efficiency, $\eta$, of 30 percent is selected, FIG. 3 indicates for $m_2 =$ 4.6 the ratio $(n_1/n_2) = 10$. Since $n_2$ equals $6 \times 10^{15}$ $\text{cm}^{-3}$, $n_1$ must equal $6 \times 10^{16}$ $\text{cm}^{-3}$.

The value of $l_1$ is determined from equation (5). The constants $e$ and $\epsilon$ for GaAs equal $1.6 \times 10^{-19}$ coulombs and $110.6 \times 10^{-12}$ farads/meter respectively. With $n_1$ equal to $6 \times 10^{16}$ $\text{cm}^{-3}$, $E_c$ equals $5.5 \times 10^5$ v/cm from the Watson graph, and with $E_c$ known, FIG. 2 yields $m_1$ equal to 3. Substituting all the known values into equation (5) yields:

$$l_1 = 0.16\ \text{micron}.$$

For the ordinary $P^+-n-n^+$ *IMPATT diode structure, where* $n_1/n_2$ equals 1, the theoretical efficiency for $m =$ 6 is approximately 23 percent. The embodiment of the present IMPATT diode with $(n_1/n_2)$ equal to 10 has an efficiency of 30 percent. The improvement in efficiency is even more dramatic for high frequency IMPATT diodes which have high carrier concentrations in the $n$ region and thus smaller values of $m$.

I claim:

1. A semiconductor diode comprising a body of single crystalline semiconductor material having a region of P-type conductivity and a region of an N-type conductivity, with a PN junction therebetween, said N-type region being divided into first, second and third subregions of which the second subregion is a center subregion doped to have a carrier concentration, $n_2$, substantially exceeding intrinsic carrier concentration, and the subregion contiguous to said PN junction is said first subregion doped to have a predetermined carrier concentration, $n_1$, greater than said center subregion carrier concentration, said third subregion being doped to have a carrier concentration substantially greater than said center subregion, said center subregion having a thickness, $l_2$, and said subregion contiguous to said PN junction having a thickness, $l_1$, less than said thickness, $l_2$, so that diode punch-through voltage to said third subregion substantially equals diode breakdown voltage at a desired diode operating frequency.

2. The semiconductor diode in accordance with claim 1 in which the center subregion carrier concentration is determined by $n_2 = ½\ (E_c^2\epsilon/V_Be)$ where $E_c$ is the diode critical electric field, $V_B$ is the diode breakdown voltage, $e$ is the electron charge and $\epsilon$ is the dielectric constant of said semiconductor material, and said N-type subregion contiguous to said PN junction has a carrier concentration $n_1 = [(2\pi\eta m_2 + \mu\eta+1)/(1-\pi\eta)(n_2/m_2^2)]$ where $\eta$ is the selected operating efficiency and $m_2$ is equal to $[2 \times (6.85 \times 10^5\ ^2/E_c).]\ 2(6.85 \times 10^5/E_c)^2$, and said N-type subregion contingent to the PN junction has a thickness determined by $\{l_1 = [E_c/(m+1)\ (n_1e/\epsilon_1)]\}\ l_1 = [E_c/(m_1+1)\ (n_1e/\epsilon)]$ where $m_1$ substantially equals $m_2$.

3. The semiconductor diode in accordance with claim 1 where the operating frequency is between 1 and 100 GHz.

4. A semiconductor diode comprising a body of crystalline semiconductor material having a region of N-type conductivity with a Schottky barrier contact, said N-type region being divided into first, second and third subregions of which the second subregion is a center subregion doped to have a carrier concentration, $n_2$, substantially exceeding intrinsic carrier concentration, and the subregion contiguous to said Schottky barrier is said first subregion doped to have a predetermined carrier concentration, $n_1$, greater than said center subregion carrier concentration, said third subregion being doped to have a carrier concentration substantially greater than said center subregion, said center subregion having a thickness, $l_2$, and said subregion contiguous to said Schottky barrier contact having a thickness, $l_1$, less than said thickness, $l_2$, so that diode punch-through voltage to said third subregion substantially equals diode breakdown voltage at a desired diode operating frequency.

* * * * *